United States Patent
Adamski (10) Patent No.: US 10,690,708 B2
(45) Date of Patent: Jun. 23, 2020

(54) DIFFERENTIAL PHASE AND AMPLITUDE DETECTOR

(71) Applicant: pSemi Corporation, San Diego, CA (US)

(72) Inventor: Jaroslaw Adamski, Streamwood, IL (US)

(73) Assignee: pSemi Corporation, San Diego, CA (US)

( * ) Notice: Subject to any disclaimer, the term of this patent is extended or adjusted under 35 U.S.C. 154(b) by 94 days.

(21) Appl. No.: 16/115,435

(22) Filed: Aug. 28, 2018

(65) Prior Publication Data
US 2020/0072882 A1 Mar. 5, 2020

(51) Int. Cl.
*G01R 25/00* (2006.01)

(52) U.S. Cl.
CPC .................. *G01R 25/005* (2013.01)

(58) Field of Classification Search
CPC .............................. G01R 25/005; H03D 13/00
See application file for complete search history.

(56) References Cited

U.S. PATENT DOCUMENTS

| | | | | |
|---|---|---|---|---|
| 8,258,879 B2 * | 9/2012 | Lu | ............................ | H03B 27/00 331/2 |
| 8,970,313 B2 * | 3/2015 | Morris | .................. | H03K 3/0231 331/111 |
| 9,178,493 B1 | 11/2015 | Nobbe | | |
| 9,535,110 B2 | 1/2017 | Nobbe | | |
| 9,864,000 B2 | 1/2018 | Nobbe et al. | | |
| 2002/0167339 A1 * | 11/2002 | Chang | ..................... | H03K 5/082 327/3 |
| 2009/0237161 A1 | 9/2009 | Fagg | | |
| 2010/0164621 A1 | 7/2010 | Srinivasan et al. | | |
| 2012/0161850 A1 | 6/2012 | Rangarajan et al. | | |
| 2017/0279439 A1 | 9/2017 | Iversen | | |

FOREIGN PATENT DOCUMENTS

KR 1020080065115 7/2008

OTHER PUBLICATIONS

Korean Intellectual Property Office, International Search Report received from the KIPO dated Dec. 16, 2019 for appln. No. PCT/US2019/048194, 9 pgs.

* cited by examiner

*Primary Examiner* — Noam Reisner
(74) *Attorney, Agent, or Firm* — Jaquez Land Greenhaus LLP; Alessandro Steinfl, Esq.

(57) ABSTRACT

A differential phase and amplitude detector circuit is presented. Two source follower circuits respectively based on NMOS and PMOS transistors are used to charge and discharge a sampling capacitor asymmetrically to provide a measurement of phase and/or amplitude difference between two signals of a substantially same frequency. The measurement can be made in one cycle, with the charging of the sampling capacitor performed during a first half cycle where a voltage difference between the two signals is positive, and the discharging during a second half cycle where a voltage difference between the two signals is negative. Biasing of the two source follower circuits enable an excess current flow between the two transistors of the two source follower circuits beyond a biasing current of the transistors to charge the sampling capacitor during the first half cycle, and disable the excess current flow between the two transistors during the second half cycle.

17 Claims, 9 Drawing Sheets

DIFFERENTIAL PHASE AND AMPLITUDE DETECTOR

CROSS REFERENCE TO RELATED APPLICATIONS

The present application may be related to U.S. Pat. No. 9,178,493, entitled "Mismatch Detection Using Replica Circuit", issued on Nov. 3, 2015, the disclosure of which is incorporated herein by reference in its entirety. The present application may also be related to U.S. Pat. No. 9,535,110, entitled "Mismatch Detection Using Replica Circuit", issued on Jan. 3, 2017, the disclosure of which is incorporated herein by reference in its entirety. The present application may also be related to U.S. Pat. No. 9,864,000, entitled "Mismatch Detection Using Replica Circuit", issued on Jan. 9, 2018, the disclosure of which is incorporated herein by reference in its entirety.

TECHNICAL FIELD

The present teachings relate to electronic circuits. In particular, the present teachings relate to circuits for detection of a difference in phase and/or amplitude of two radio frequency (RF) signals.

BACKGROUND

In some applications it may be desirable to compare a difference in either one or both of a phase and an amplitude of two RF signals. For example, the above referenced related applications discuss various circuits for detecting difference in operating characteristics of a main circuit by using a replica circuit as a reference. A sensed difference in operating characteristics of the two circuits can then be used to drive a tuning control circuit to minimize the sensed difference. In some cases, the operating characteristics may influence amplitude and/or phase of an RF signal processed by the main circuit, and therefore the sensed difference can be based on a difference in amplitude and/or phase of the RF signal processed by the main circuit and an RF signal processed by the reference replica circuit.

A person skilled in the art would realize that performance of the tuning control circuit in terms of reaction time to a detuned main circuit is affected by a sensing time of the sensed difference. Furthermore, since the operating characteristics of the main circuit are measured as a difference with respect to ones of the reference replica circuit, sensing of the operating characteristics may be performed without requirement for complex calibration (e.g., as would be required for sensing an absolute value of an operating characteristic) of the sensing circuit.

It follows that in such application where a difference in either one or both of the phase and amplitude of two RF signals (of main and reference circuits) is required, a simple, low power, small size, and fast differential amplitude and/or phase detection circuit may be used. A motivation for the teachings according to the present disclosure is to provide such circuit.

SUMMARY

According to a first aspect of the present disclosure, a circuit arrangement is presented, the circuit arrangement comprising: a first differential phase and amplitude detector, comprising: an NMOS transistor; a PMOS transistor; a first input coupled to a gate node of the NMOS transistor, the first input configured for receiving a first radio frequency (RF) signal having a first voltage; a second input coupled to a gate node of the PMOS transistor, the second input configured for receiving a second RF signal having a second voltage; a differential output comprising a first node coupled to a source node of the NMOS transistor and a second node coupled to a source node of the PMOS transistor, and a sampling capacitor coupled between the first node and the second node; wherein: when the first voltage and the second voltage are equal, a first DC biasing current flows through the NMOS transistor, a second DC biasing current flows through the PMOS transistor, and no current flows between the first node and the second node, when the first voltage is larger than the second voltage, an excess current sourced by the NMOS transistor and sinked by the PMOS transistor flows from the first node to the second node to charge the sampling capacitor, the excess current having a magnitude that is substantially larger than the first DC biasing current, and when the first voltage is smaller than the second voltage, no current flows between the NMOS transistor and the PMOS transistor, and the sampling capacitor is discharged by a portion of the first and the second DC biasing currents that flow from the second node to the first node.

According to second aspect of the present disclosure, a method for detecting a phase and amplitude difference between two RF signals is presented, the method comprising: providing an NMOS transistor configured as a first source follower circuit for controlling a voltage at a first node based on a first voltage of a first input RF signal; providing a PMOS transistor configured as a second source follower circuit for controlling a voltage at a second node based on a second voltage of a second input RF signal; coupling a sampling capacitor between the first node and the second node; biasing the first and second source flower circuits, thereby maintaining a substantially fixed voltage across the sampling capacitor; inputting the first input RF signal to the first source follower circuit and inputting the second input RF signal to the second source follower circuit; and based on the inputting, charging the sampling capacitor when the first voltage is larger than the second voltage, and discharging the sampling capacitor when the first voltage is smaller than the second voltage, wherein the charging is at a rate that is substantially larger than a rate of the discharging.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept, as disclosed herein.

Figure 1A:
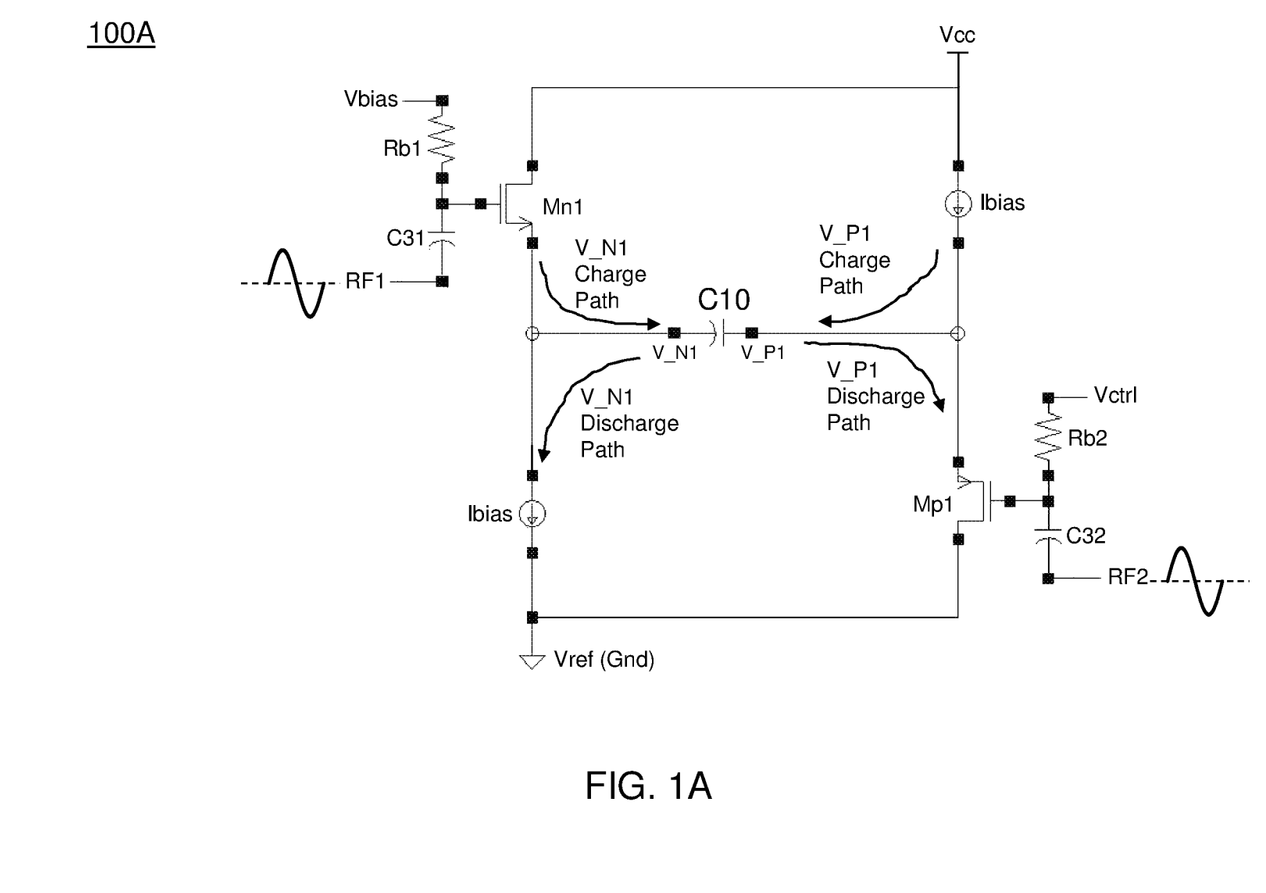
FIG. 1A shows a simplified schematic of a circuit according to an embodiment of the present disclosure that can measure a difference in amplitude and/or phase of two RF signals, RF1 and RF2.

The present disclosure describes a simple, low power, small size, and fast differential amplitude and/or phase detection circuit. A simplified schematic diagram of such circuit, according to an embodiment of the present disclosure, is shown in FIG. 1A. The circuit (100A) of FIG. 1A receives two signals, RF1 and RF2, which may be of a substantially same frequency, and generates a difference signal across a capacitor C10 based on a difference in peak voltages of the two signals. In a case where the two signals are of a substantially same frequency, such difference in peak voltages may be due to a difference in amplitude of the two signals (e.g., FIG. 4A, ΔPeak1, later described), a difference in phase of the two signals (e.g., FIG. 4B, ΔPeak1, later described), or a combination of differences in amplitude and phase of the two signals.

As will be described below with reference to FIGS. 1B-1F, in a case where the two signals are of a substantially same frequency, the difference in peak voltages may be detected by the circuit (100A) of FIG. 1A during a half cycle (positive half or negative half) of the RF1 signal. In other words, during a time that is equal to one period of the RF1 signal (and therefore one period of the RF2 signal), the voltage across the capacitor C10 may be updated to represent the difference in peak voltages. In particular, the capacitor C10 can be charged during a first half cycle of the RF1 signal with a charging current that is substantially larger than a discharging current that discharges the capacitor C10 during a second half cycle of the RF1 signal. Such asymmetry in the charging and discharging of the capacitor C10 can be provided by an excess charging current capability provided by an NMOS transistor, Mn1, in a case where the difference in peak voltages between the two signals RF1 and RF2 is positive. In a case, where the difference is negative, the discharging current that discharges the capacitor C10 can be provided by current of substantially smaller magnitude through a current source, Ibias. Finally, in a case where the difference in peak voltages is zero, the capacitor remains in a same charged condition and therefore the voltage across the capacitor remains the same.

It should be noted that as used herein, charging of the capacitor C10 refers to increasing a voltage differential between two terminals of the capacitors (e.g., at nodes V_N1 and V_P1), and discharging of the capacitor C10 refers to decreasing the voltage differential between the two terminals. Therefore, the capacitor C10 may be charged by any one of: a) increasing a voltage at the node V_N1 while maintaining a same voltage at the node V_P1, b) decreasing a voltage at the node V_P1 while maintaining a same voltage at the node V_N1, c) increasing a voltage at the node V_N1 and decreasing a voltage at the node V_P1, and more generally, d) varying one or both voltages at nodes V_N1 and V_P1 such that a voltage at node V_N1 is larger than a voltage at node V_P1. Also, the capacitor C10 may be discharged by any one of: e) decreasing a voltage at the node V_N1 while maintaining a same voltage at the node V_P1, f) increasing a voltage at the node V_P1 while maintaining a same voltage at the node V_N1, g) decreasing a voltage at the node V_N1 and increasing a voltage at the node V_P1, and more generally, h) varying one or both voltages at nodes V_N1 and V_P1 such that a voltage at node V_P1 is larger than a voltage at node V_N1. A person skilled in the art would clearly understand that charging of the capacitor C10 via, for example, case a) above, may require a current to flow through the capacitor C10 from the node V_N1 to the node V_P1, in response to which current flow the node V_N1 "charges" to a higher voltage. Likewise, charging of the capacitor C10 via, for example, case b) above, may require a current to flow through the capacitor C10 from the node V_N1 to the node V_P1, in response to which current flow the node V_P1 "discharges" to a lower voltage. In contrast, discharging of the capacitor C10 may require a current to flow from the node V_P1 to the node V_N1 for either charging the node V_P1 or discharging the node V_N1. Therefore, charging of the capacitor C10 can only be provided by a current through the capacitor C10 that is sourced by transistor Mn1 and sinked by the transistor Mp1, whereas discharging of the capacitor C10 can only be provided by a current through the capacitor C10 that is sourced and sinked by the two current sources, Ibias. Various current paths available for charging and discharging of the capacitor are shown in FIG. 1A. As used herein, the expressions "charging" and "discharging" can be used to respectively characterize a positive or negative change in voltage across the capacitor C10, or at a terminal of the capacitor represented by nodes V_N1 and V_P1.

As the charging and discharging of the capacitor C10 is proportional to the charging/discharging current though the capacitor (e.g., I=C. ΔV/ΔT), by making the magnitude of the charging current substantially larger than the magnitude of the discharging current (Ibias), the voltage across the capacitor C10 can be integrated over several cycles of the RF1 signal to reach and stabilize to a value representative of the difference in peak voltages of the RF1 and RF2 signals. Alternatively, any of the values for the magnitude of the charging current, discharging current, ratio of the charging and discharging currents, or capacitance of C10 may be selected, in view of a frequency of the RF1, RF2 signals, so to get a stabilized voltage value across the capacitor C10 representative of the difference in peak voltages of the RF1 and RF2 signals after one cycle (period). A person skilled in the art would know of many ways suitable for selection of such values in view of design goals and performance of the circuit (100A) of FIG. 1A. In particular, magnitude of the charging current sourced by the NMOS transistor Mn1, or its ratio to a magnitude of the current source Ibias, may be adjusted through selection of an appropriate size of the transistor Mn1, and likewise for the PMOS transistor Mp1. Such flexibility in selection of the sizes of the two transistors and associated current sources Ibias provide flexibility in design in view of desired goals and tradeoffs. Accordingly, a person skilled in the art would realize that the two current sources Ibias may not necessarily source a same biasing current magnitude. For the sake of simplicity in the following description, it is assumed that sizes of the two transistors and magnitudes of the associated biasing currents to be same.

With further reference to the circuit (100A) of FIG. 1A, as can be seen in the figure, the NMOS transistor, Mn1, is configured as a source follower with its source node coupled (connected) to a first terminal of a capacitor C10 at node V_N1, and its gate node coupled to a coupling capacitor C31 for receiving the RF1 signal. Biasing of the transistor Mn1 is provided via a supply voltage coupled to a drain node of the transistor and a DC biasing voltage, Vbias, coupled to the gate node of the transistor through a series connected resistor, Rb1. A current source, Ibias, coupled between the source node of the transistor Mn1 and a reference potential (Gnd), controls a biasing current through (sourced by) the transistor Mn1 when the RF1 signal is not input to the circuit (100A) through the gate node of the transistor Mn1.

As can be seen in FIG. 1A, a first terminal of the capacitor C10, represented in the figure by the node, V_N1, is coupled to the source node of the transistor Mn1 and the current source, Ibias. Also, the second terminal of the capacitor C10, represented by the node, V_P1, is coupled to the source node of a PMOS transistor Mp1 and a second current source, Ibias. A person skilled in the art would clearly understand that the PMOS transistor Mp1 is configured as a source follower with its source node coupled (connected) to the second terminal of the capacitor C10 at node V_P1, and its gate node coupled to a coupling capacitor C32 for receiving the RF2 signal. Biasing of the transistor Mp1 is provided via a supply voltage coupled to the source node of the transistor through the second current source Ibias, and a DC biasing voltage, Vctrl, coupled to the gate node of the transistor through a series connected resistor, Rb2. The second current source, Ibias, coupled between the supply voltage Vcc and the source node of the transistor Mp1 controls a biasing current through (sinked by) the transistor Mp1 when the RF2 signal is not input to the circuit (100A) through the gate node of the transistor Mp1. The drain node of the transistor Mp1 is coupled to the reference potential (Gnd).

According to an exemplary embodiment of the present disclosure, the DC biasing voltages, Vbias and Vctrl, may be selected such that when the signals RF1 and RF2 are not present (e.g., zero amplitude), a (DC) voltage at the node V_N1 is equal to a voltage at the node V_P1. According to another exemplary embodiment of the present disclosure, such DC biasing voltages may be selected such that when the signals RF1 and RF2 are not present, a (DC) voltage at the node V_N1 is larger than a voltage at the node V_P1. According to a further embodiment of the present disclosure, and as described with reference to FIG. 3 later described, the DC biasing voltage, Vctrl, can be made to track any variations of the circuit (100A) with respect to, for example, temperature, so to maintain a constant offset (e.g., zero or positive offset) between the voltages at nodes V_N1 and V_P1.

A person skilled in the art would realize that in the absence of the RF1 and RF2 signals to the circuit (100A), the two DC biasing voltages Vbias and Vctrl, in combination, maintain a desired offset voltage (e.g., zero volts) between the two nodes V_N1 and V_P1 while a substantially same biasing current, Ibias, flows through each of the transistors Mn1 and Mp1. It should be noted however that such transistors have the capability to respectively source and sink currents in excess of Ibias. Any perturbation of voltages at either one or both of the two nodes V_N1 and V_P1, as a consequence of, for example, an input voltage of either or both of the RF1 and RF2 signals, may in turn induce additional currents through the capacitor C10 so to charge and/or discharge the two nodes VN_1 and V_P1. As described above, such currents may be through the two transistors Mn1 and Mp1 for charging of the capacitor C10, or through the current sources, Ibias, for discharging of the capacitor C10.

For example, inputting a signal RF1 (non-zero amplitude) at the gate of the transistor Mn1 and no signal at the gate of the transistor Mp1 (e.g., RF2 with zero amplitude), can cause the node V_N1 to charge (to a higher voltage) during the positive half cycle of the RF1 signal, through an excess current sourced by the transistor Mn1 and sinked by the transistor Mp1, which current flows through the capacitor C10 and to ground through the transistor Mp1. During the negative half cycle of the RF1 signal, the node V_N1 discharges through a current provided by the two current sources, Ibias. As a sourcing and sinking current capability of the transistors Mn1 and Mp1 may be substantially larger than the current capability of the current sources Ibias, discharging of the capacitor C10 during the negative half cycle may be negligible when compared to the charging during the positive half cycle.

Similarly, inputting a signal RF2 (non-zero amplitude) at the gate of the transistor Mp1 and no signal at the gate of the transistor Mn1 (e.g., RF1 with zero amplitude), can cause the node V_P1 to discharge (to a lower voltage) during the negative half of the RF2 cycle, through an excess current sinked by the transistor Mp1 and sourced by the transistor Mn1, which current flows through the capacitor C10 and to ground through the transistor Mp1. During the positive half cycle of the RF2 signal, the node V_P1 charges through a current provided by the two current sources, Ibias. As a sourcing and sinking current capability of the transistors Mn1 and Mp1 may be substantially larger than the current capability of the current sources Ibias, discharging of the capacitor C10 during the positive half cycle may be negligible when compared to the charging during the negative half cycle.

Based on the above examples, it would be clear to a person skilled in the art that a voltage at the node V_N1 may be charged by a current sourced by the transistor Mn1 that is in excess of the biasing current though the current source Ibias, and discharged by the current source Ibias. Corresponding current conduction paths are clearly denoted in FIG. 1A as V_N1 charge_path and V_N1_discharge_path respectively. Likewise, a voltage at the node V_P1 may be charged by the second current source Ibias, and discharged by a current sinked by the transistor Mp1 that is in excess of the biasing current through the second current source Ibias. Corresponding current conduction paths are clearly denoted in FIG. 1A as V_P1_charge_path and V_P1_discharge_path respectively. It should also be clear to a person skilled in the art that the charging and discharging of the nodes V_N1 and V_P1 is based on current conduction through the complementary current paths (V_N1_charge_Path, V_P1_discharge_path) and (V_P1_charge_Path, V_N1_discharge_path) respectively for charging and discharging of the capacitor C10.

Therefore, as shown in FIG. 1A, charging of the node V_N1 by an excess current sourced by the transistor Mn1 can only be realized if such current is conducted through the capacitor C10, an therefore sinked through the discharge path (V_P1_discharge_path) provided by the source follower circuit of the transistor Mp1. Likewise, discharging of the node V_P1 by an excess current sinked by the transistor Mp1 can only be realized if such current is conducted through the capacitor C10, an therefore sourced through the charge path (V_N1_charge_path) provided by the source follower circuit of the transistor Mn1. Therefore, the two source follower circuits operate as complementary circuits for the charging of the capacitor C10: one circuit injects (sources) current and the other provides a conduction path of the current to ground (sinks). Biasing of the two source follower circuits allows such complementary operation when the source follower circuit of the transistor Mn1 attempts to control (charge) the voltage at the node V_N1 to a value that is higher than a voltage at the node V_P1 controlled by the source follower circuit of the transistor Mp1. On the other hand, when the source follower circuit of the transistor Mn1 attempts to control (charge) the voltage at node V_N1 to a value that is lower than a voltage at node V_P1 controlled by the source follower circuit of the transistor Mp1, the capacitor C10 is discharged by a conduction path provided by the two current sources, Ibias. This is shown in FIGS. 1B-1F for a case where the two signals RF1 and RF2 are of a substantially same frequency and in phase, but with different positive/negative peak voltages.

Figure 1B:
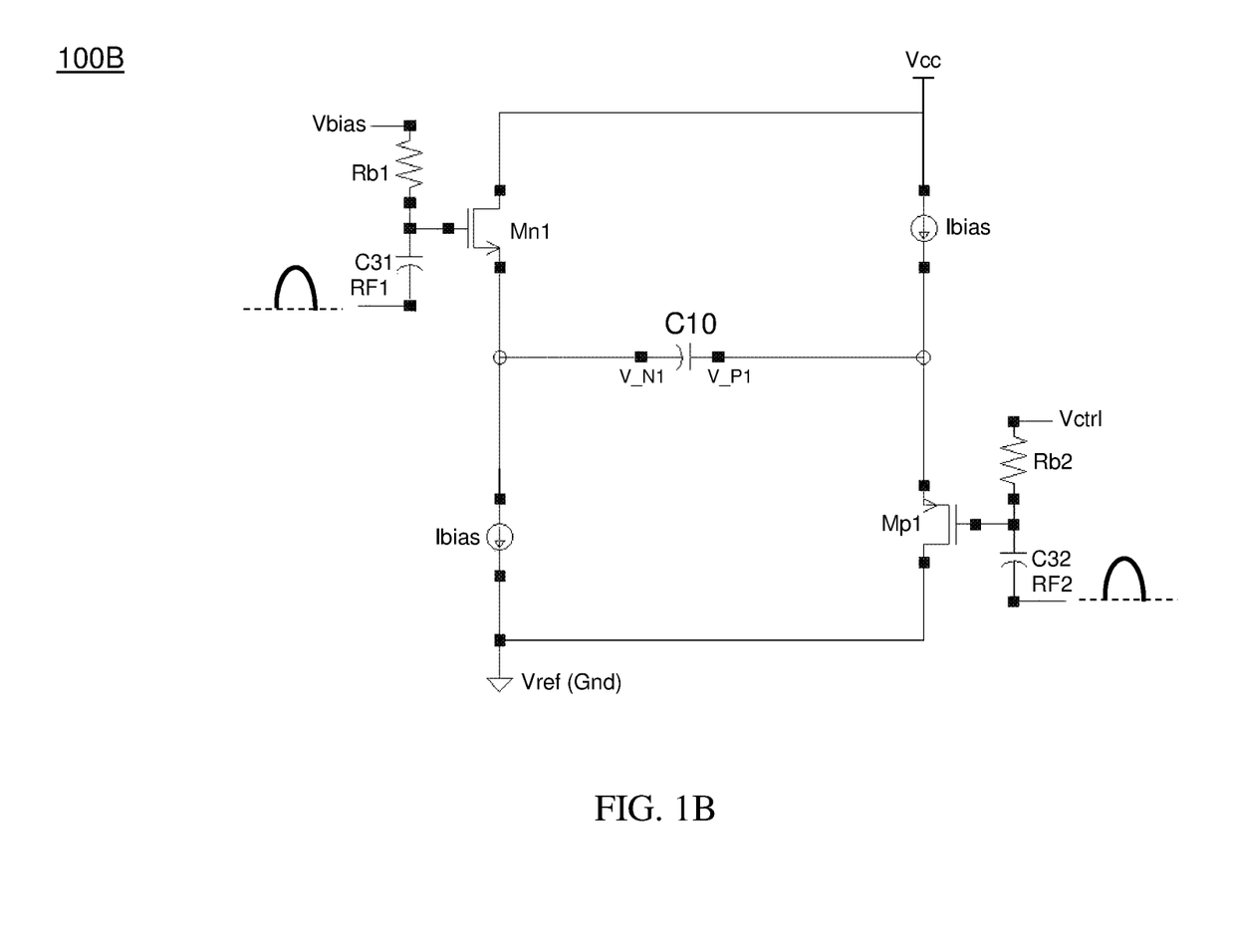
FIG. 1B shows a current flow in the circuit of FIG. 1A for a case where a peak voltage during a positive cycle of the RF1 signal is equal to a peak voltage during a positive cycle of the RF2 signal.

FIG. 1B shows a current flow in the circuit of FIG. 1A for a case where a (positive) peak voltage during a positive cycle of the RF1 signal is equal to a peak voltage during a positive cycle of the RF2 signal. As noted above, since both source follower circuits attempt to control voltages at the two nodes V_N1 and V_P1 to a same value, there is no current flow through the capacitor C10, and therefore a voltage across the capacitor C10 does not change.

Figure 1C:
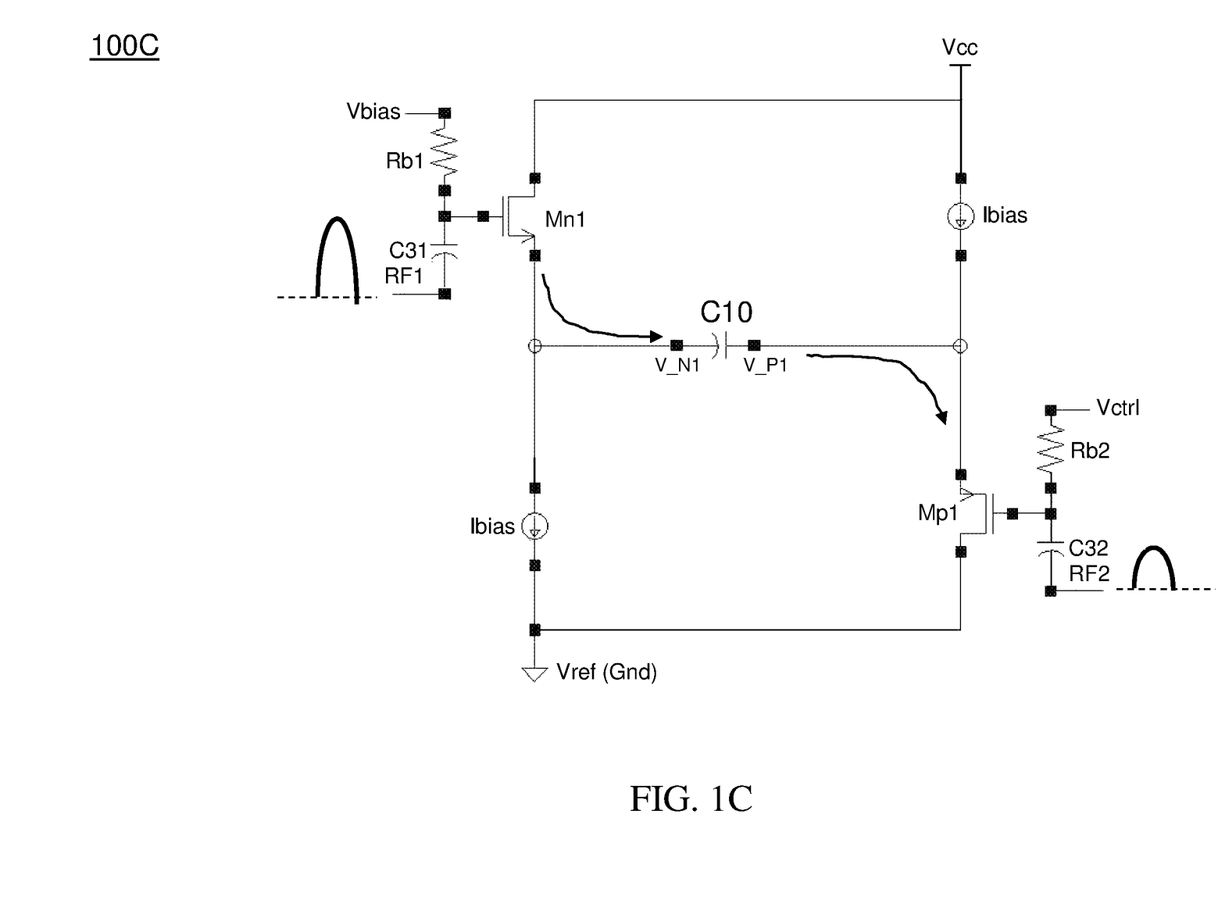
FIG. 1C shows a current flow in the circuit of FIG. 1A for a case where a peak voltage during a positive cycle of the RF1 signal is larger than a peak voltage during a positive cycle of the RF2 signal.

FIG. 1C shows a current flow in the circuit of FIG. 1A for a case where a peak voltage during a positive cycle of the RF1 signal is larger than a peak voltage during a positive cycle of the RF2 signal. In this case, an excess current sourced by the transistor Mn1 flows through the capacitor C10 and is sinked by the transistor Mp1. Accordingly the nodes V_N1 and V_P1 respectively charge to voltages representative of the respective peak voltages of the RF1 and RF2 signals, and therefore, the capacitor C10 charges to a voltage that is representative of the difference of the peak voltages. As described above, based on a ratio of the currents through the transistors Mn1, Mp1, a capacitance of the capacitor C10, and a frequency of the signals RF1 and RF2, the voltages at the two nodes V_N1 and V_P1, and therefore the voltage across the capacitor, may settle within one or a plurality of cycles of the signals. A person skilled in the art would realize that the peak RF voltage of the RF2 signal may act to shut off the transistor Mp1, thus reducing the charging current through the capacitor C10. However, the increasing voltage at node V_N1 may pull up a voltage at the node V_P1 which may increase the gate-to-source voltage Vgs of the transistor Mp1 and thus increase a current through the transistor Mp1.

Figure 1D:
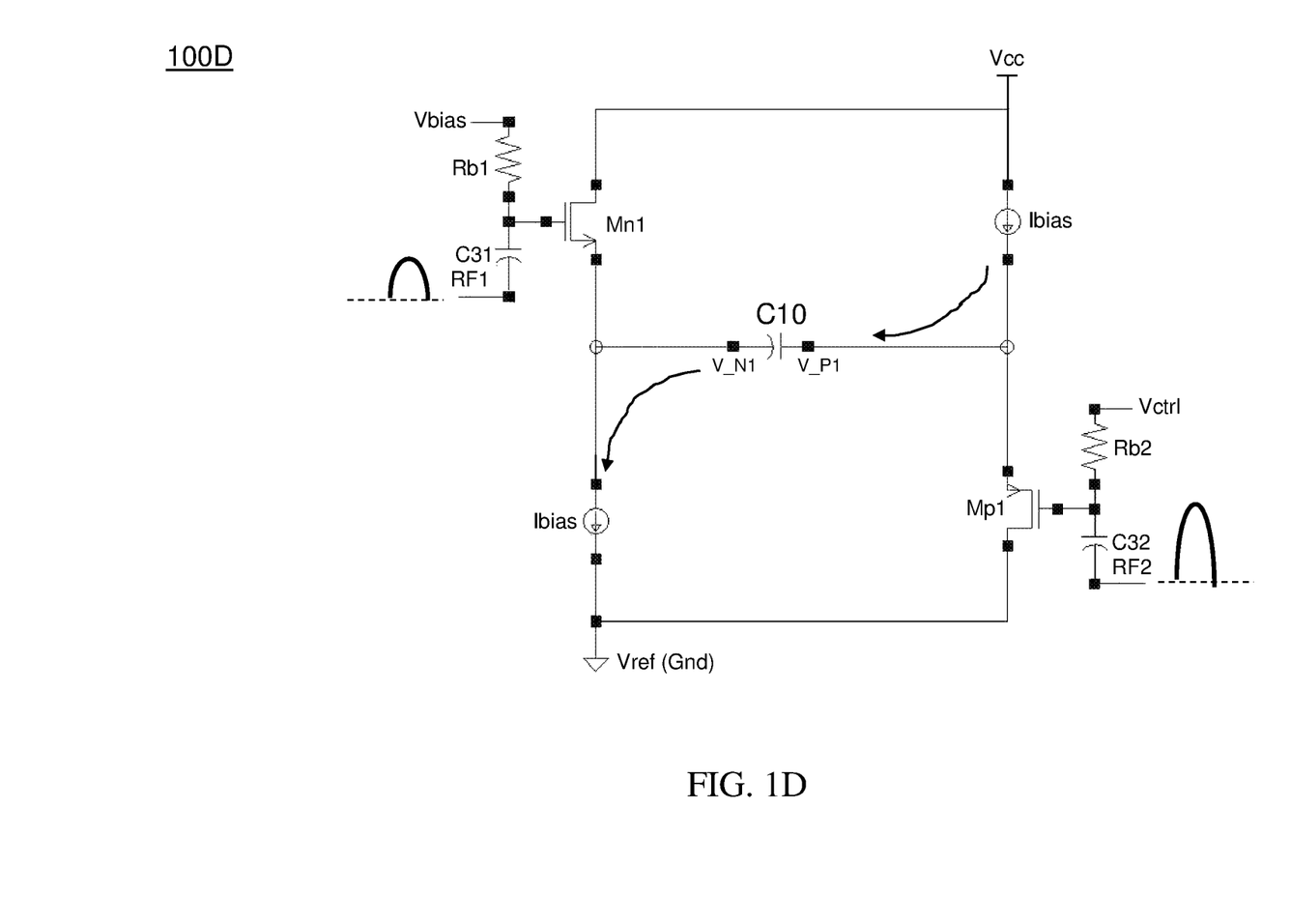
FIG. 1D shows a current flow in the circuit of FIG. 1A for a case where a peak voltage during a positive cycle of the RF1 signal is smaller than a peak voltage during a positive cycle of the RF2 signal.

FIG. 1D shows a current flow in the circuit of FIG. 1A for a case where a peak voltage during a positive cycle of the RF1 signal is smaller than a peak voltage during a positive cycle of the RF2 signal. In this case, a current through the two current sources, Ibias, slowly discharges the capacitor C10.

Figure 1E:
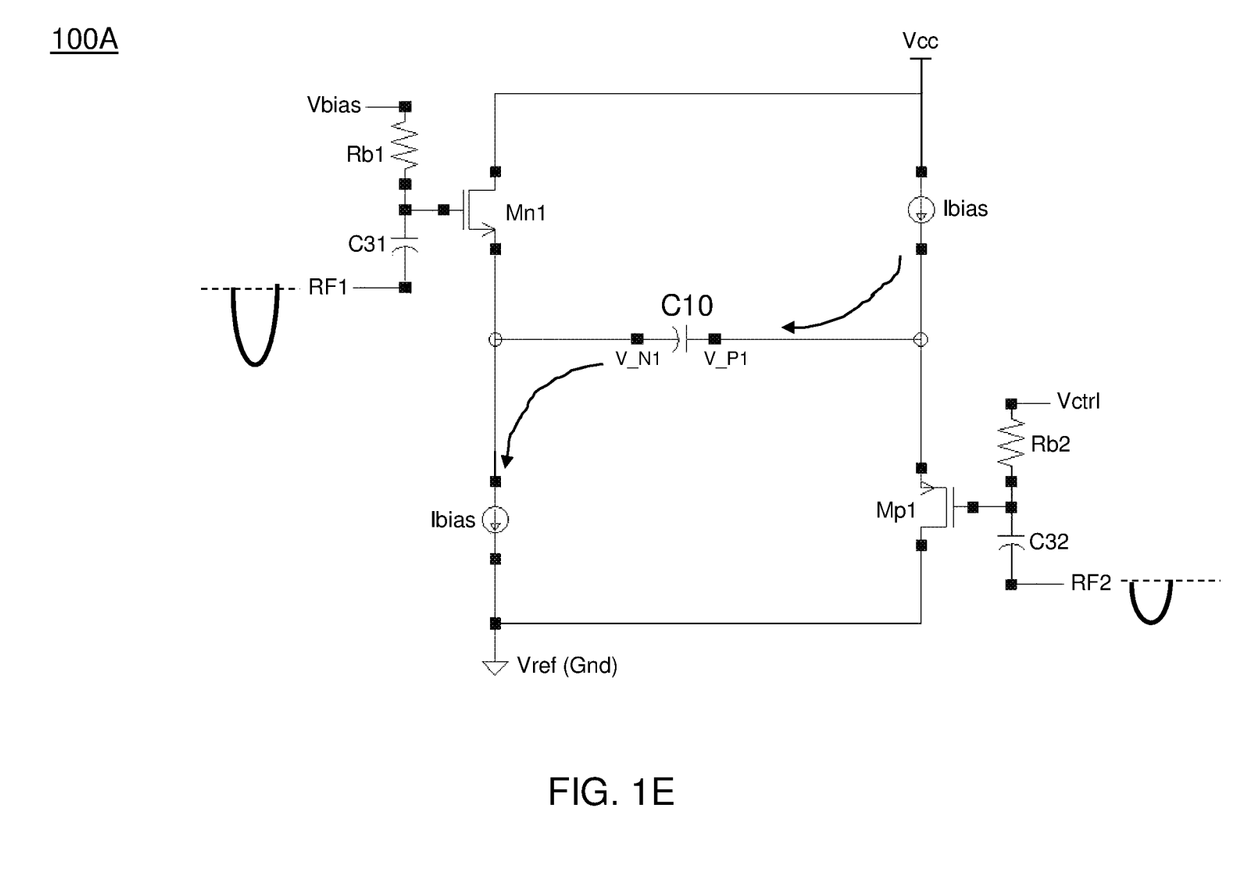
FIG. 1E shows a current flow in the circuit of FIG. 1A for a case where a peak voltage during a negative cycle of the RF1 signal is larger than a peak voltage during a negative cycle of the RF2 signal.

FIG. 1E shows a current flow in the circuit of FIG. 1A for a case where a peak voltage during a negative cycle of the RF1 signal is larger than a peak voltage during a negative cycle of the RF2 signal. In this case, the peak voltage that node V_N1 is driven to (attempt to be controlled) is less positive than the peak voltage that the node V_P1 is driven to, and therefore same discharging behavior of the capacitor C10 as described in reference to FIG. 1D is provided. It should be noted that the peak voltages shown in FIG. 1E may be considered as complementary voltages to ones depicted in FIG. 1C, where FIG. 1C shows current flow during the positive half cycle of the RF1, RF2 signals, and FIG. 1E during the negative half cycle. Accordingly, such two figures show that a fast charging of the capacitor C10 can be provided during the positive half cycle, and a slower discharge of the capacitor C10 can be provided during the negative half cycle, so that at the end of one cycle of the RF1 and RF2 signals, the capacitor C10 is charged by a value representative of a difference in the peak voltages detected during the positive half cycle. According to an exemplary embodiment of the present disclosure, the biasing current provided by the current source Ibias is selected to be less than about ⅕ to ⅒ of a peak current provided by the NMOS transistor Mn1. Such selection of the biasing current may relate to a sensitivity of the detector circuit according to the present disclosure, a ripple on the capacitor C10, and a transient response or bandwidth of the detector circuit. It should be understood that the biasing current can be set to a wide range of values to satisfy any design goals and tradeoffs.

Figure 1F:
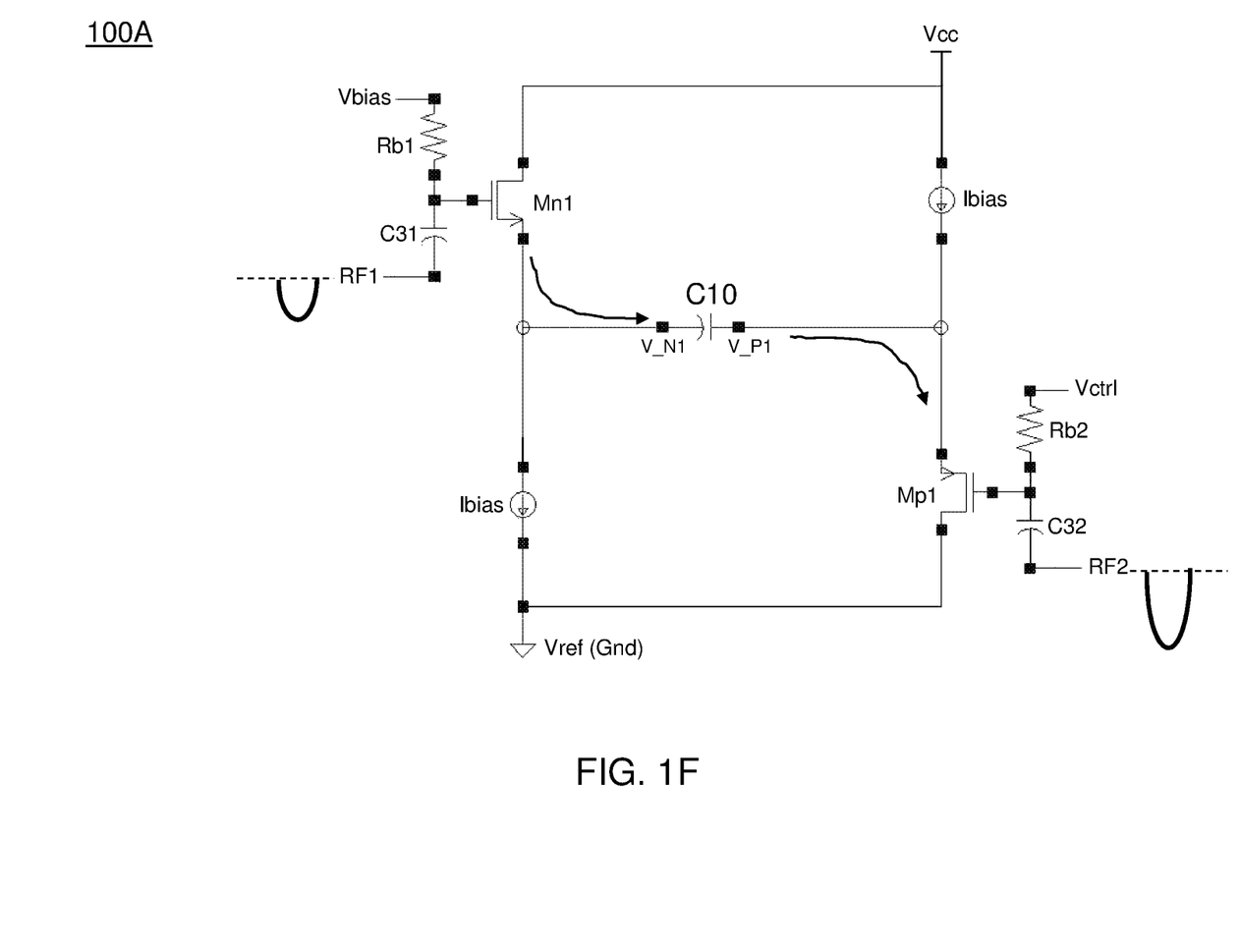
FIG. 1F shows a current flow in the circuit of FIG. 1A for a case where a peak voltage during a negative cycle of the RF1 signal is smaller than a peak voltage during a negative cycle of the RF2 signal.

FIG. 1F shows a current flow in the circuit of FIG. 1A for a case where a peak voltage during a negative cycle of the RF1 signal is smaller than a peak voltage during a negative cycle of the RF2 signal. In this case, the peak voltage that node V_N1 is driven to is more positive than the peak voltage that the node V_P1 is driven to, and therefore same charging behavior of the capacitor C10 as described in reference to FIG. 1C is provided. In other words, as it would clearly be understood by a person skilled in the art, the capacitor C10 gets charged on the positive cycle if RF1 is larger than RF2, and the capacitor C10 gets charged on the negative cycle if RF1 is smaller than RF2. Accordingly, the detector according to the present disclosure can respond to a magnitude of a difference (e.g., absolute value) in the RF inputs and not a sign of the difference.

It should be noted that the peak voltages shown in FIG. 1F may be considered as complementary voltages to ones depicted in FIG. 1D, where FIG. 1D shows current flow during the positive half cycle of the RF1, RF2 signals, and FIG. 1F shows the current flow during the negative half cycle. Accordingly, such two figures show that a fast charging of the capacitor C10 can be provided during the negative half cycle, and a negligible (slow) discharge of the capacitor C10 can be provided during the positive half cycle, so that at the end of one cycle of the RF1 and RF2 signals, the capacitor C10 is charged by a value representative of a difference in the peak voltages detected during the negative half cycle.

Figure 4A:
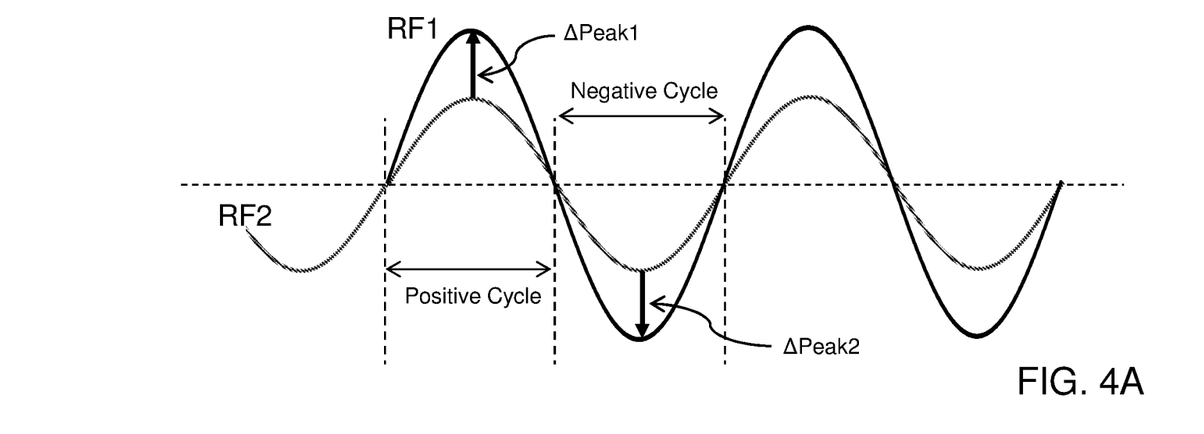
FIG. 4A and FIG. 4B respectively show a top graph with two RF signals having same phase but different amplitudes, and a bottom graph with two RF signals having same amplitude but different phases.

In view of the description above with reference to FIGS. 1A-1F, it becomes apparent that the circuit (100A) may charge the capacitor C10 during a half cycle of the signals RF1, RF2, where the peak voltage presented at the gate of the transistor Mn1 is larger (more positive or less negative) than the peak voltage presented at the gate of the transistor Mp1. Assuming that the RF1 signal has a larger amplitude than the RF2 signal, as shown in the graph of FIG. 4A, where a difference in peak voltages during the positive cycle of the RF1 and RF2 signals is represented by a positive value ΔPeak1 (per FIG. 4A). Accordingly, as described above, (fast) charging of the capacitor C10 occurs during the positive cycle and (slow) discharging of the capacitor C10 occurs during the negative cycle. However, as can be seen in the graph of FIG. 4A, during the negative cycle of the RF1 and RF2 signals, a peak voltage of the RF2 signal is larger (less negative) than a peak voltage of the RF1 signal, with a difference in peak voltages being represented by −ΔPeak2 (per FIG. 4A). Therefore, feeding the RF2 signal shown in the graph of FIG. 4A to the gate of the Mn1 transistor of FIG. 1A and feeding the RF1 signal shown in the graph of FIG. 4A to the gate of the Mp1 transistor of FIG. 1A, can provide a charging of the capacitor C10 according to a differential peak voltage between the two RF1 and RF2 signals measured during the negative cycle of the signals. Accordingly, and as shown in FIG. 2, by providing two parallel circuits (100A), with swapped couplings of the two RF1 and RF2 signals to the gates of the transistors Mn1 and Mp1, complementary peak voltage differences of the two signals based on charging/discharging of the respective capacitors, C10, C'10, during complementary half cycles can be provided.

Figure 2:
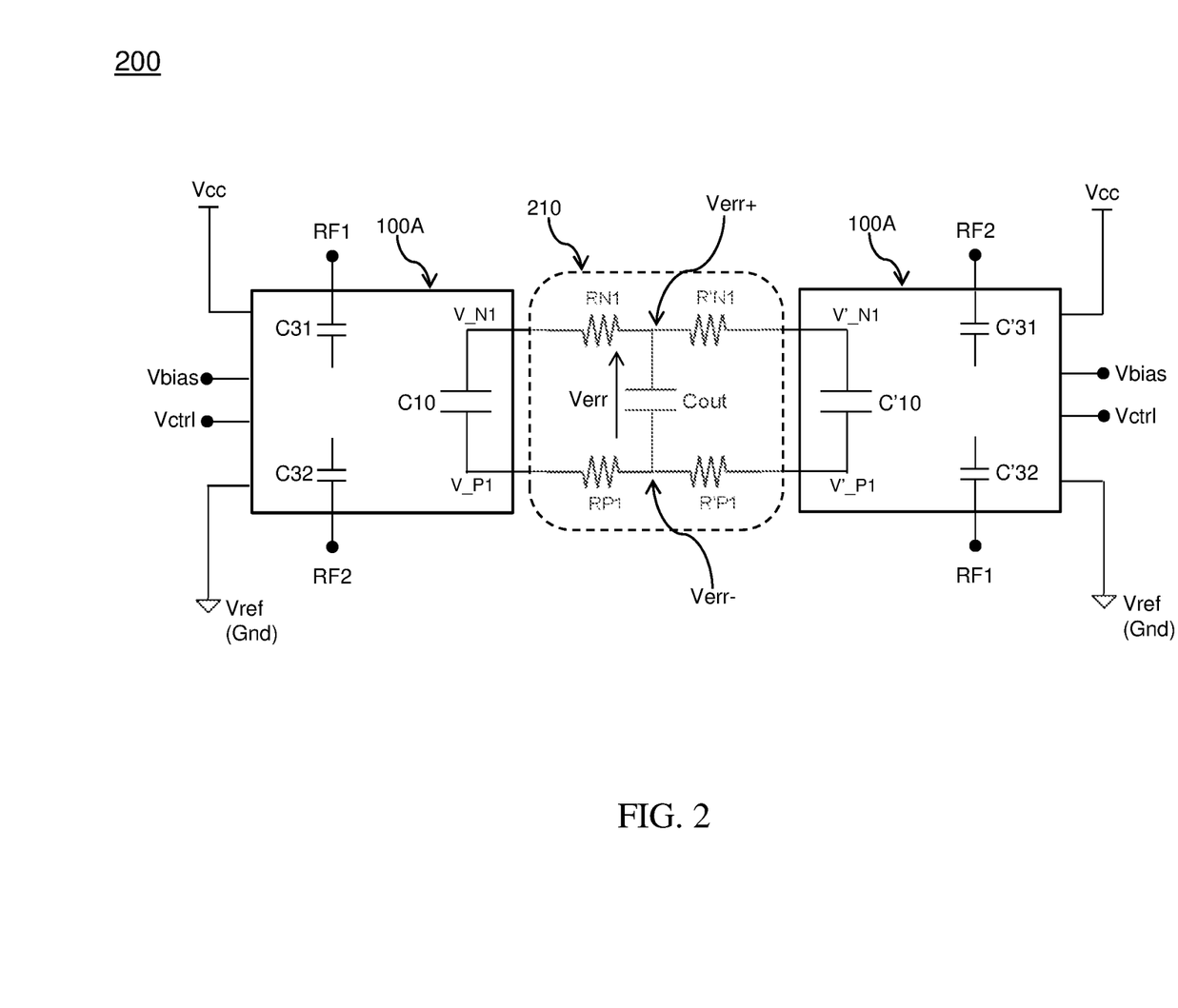
FIG. 2 shows a block diagram of a combined differential phase and amplitude detection circuit according to an embodiment of the present disclosure, wherein two circuits per FIG. 1A are used in parallel to provide complementary amplitude and/or phase difference signals to a filter circuit.

FIG. 2 shows a block diagram (200) of a combined differential phase and amplitude detection circuit according to an embodiment of the present disclosure, wherein two circuits (100A) as described above with reference to FIGS. 1A-1F are used in parallel to provide two complementary amplitude and/or phase difference voltages which are combined through a circuit (210). As can be seen in the block diagram (200) of FIG. 2, the RF1 and RF2 signals are respectively coupled to the coupling capacitors C31 and C32 of a first circuit (100A), and to the coupling capacitors C'32 and C'31 of a second (duplicate) circuit (100A), where both circuits are biased by same biasing voltages Vbias, Vctrl, and operated between a supply voltage Vcc and reference potential, Gnd. Accordingly, as described above, the two parallel circuits (100A) charge/discharge the respective capacitors C10 and C'10 during complementary half cycles of the RF1 and RF2 signals. In other words, during each cycle, a first peak voltage difference based on (fast) charging of the capacitor C10 during a first half cycle, and a second peak voltage difference based on a (fast) charging of the capacitor C'10, are provided. By combining such two peak voltage differences through the circuit (210), a higher resolution differential phase and/or amplitude detection can be obtained (as compared to a single circuit 100A). The complementary configuration provided by the circuit of FIG. 2 provides charging or discharging for both the positive and negative portions of the cycle, thus reducing ripple and improving the sensitivity. The circuit of FIG. 2 also provides symmetry in the amplitude and phase responses of the circuit because it includes symmetrical use of the NMOS and PMOS devices.

A person skilled in the art would clearly understand that the circuit (210) depicted in FIG. 2 is a simple exemplary non-limiting implementation of a circuit that can combine (sum) two differential voltages into a single differential voltage, comprising resistor pairs (RN1, RP1) and (R'N1, R'P1) coupling respective nodes (V_N1, V_P1) and (V'_N1, V'_P1) to a capacitor Cout.

Accordingly, a differential voltage, Verr, across the capacitor, Cout, is substantially equal to (V_N1−V_P1)+ (V'_N1−V'_P1), and represents a differential phase and/or amplitude of the RF1 and RF2 signals. A person skilled in the art would realize that the differential voltages across the capacitors C10 and C'10 may be processed by circuits different from the circuit (210) shown in FIG. 2, including analog circuits including active devices (transistors, OpAmps) and/or digital circuits. In addition, the differential voltage Verr may be further processed for translation to a single ended voltage.

With reference back to the circuit (100A) of FIG. 1A, as described above, the source follower circuit of the transistor Mn1 may be biased via a DC biasing voltage, Vbias, provided to the gate of the transistor Mn1. Such DC biasing voltage may be in view of a desired voltage range at the node V_N1 based on the supply voltage Vcc and an expected voltage range of the input RF1 signal. In the absence of the RF1 signal (e.g., zero amplitude), biasing of the source follower circuit of the transistor Mn1 sets a voltage at the node V_N1. Accordingly, the DC biasing voltage, Vctrl, provided to the gate of the transistor Mp1 sets the voltage at the node V_P1 so to maintain a constant offset voltage across the capacitor C10. In other words, in the absence of the RF1 and RF2 signals, a voltage differential (V_N1− V_P1) across the capacitor C10 is constant, such as, for example, zero volts, or a positive voltage value. A person skilled in the art would clearly know of simulation and/or experimental methods to derive the DC biasing voltages Vbias and Vcrtl, which methods are outside the scope of the present disclosure. A person skilled in the art would also realize that by setting the value of Vctrl to be a fixed voltage in view of a desired voltage differential across the capacitor C10, any process variation that may affect operating characteristics of the two source follower circuits may affect the constant offset voltage across the capacitor C10 in the absence of the RF1 and RF2 signals, and therefore, cause an error in determining a differential phase and/or amplitude based on the circuit (100A) of FIG. 1A when provided with the RF1 and RF2 signals. It follows that according to an embodiment of the present disclosure, the DC biasing voltage Vctrl of the source follower circuit of the transistor Mp1 is based on a control loop that maintains the offset voltage across the capacitor C10 constant. A simplified schematic of an exemplary circuit (300), according to an embodiment of the present disclosure, which generates the DC biasing voltage Vctrl is shown in FIG. 3.

Figure 3:
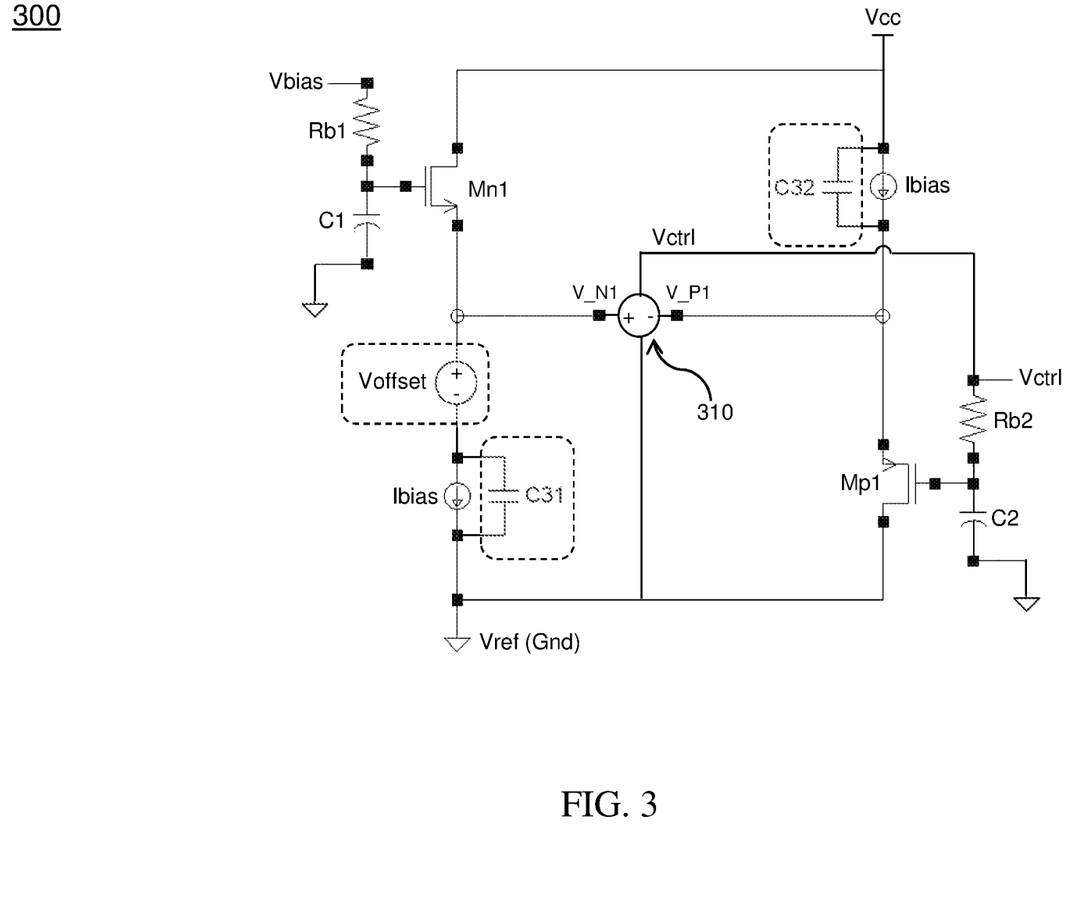
FIG. 3 shows a simplified schematic of a circuit according to an embodiment of the present disclosure that can generate a biasing control voltage for the circuit of FIG. 1A.

As can be seen in FIG. 3, the circuit (300) is similar to (e.g., a duplicate of) the circuit (100A) of FIG. 1A, with a difference that the capacitor C10 is replaced by a difference circuit (310) that compares the voltages at the nodes V_N1 and V_P1, and outputs the Vctrl voltage as a voltage that is proportional to the difference of the voltages at the nodes V_N1 and V_P1. Accordingly, the voltage Vctrl is continuously adjusted so to maintain the difference of the voltages at the two nodes V_N1 and V_P1 constant. Furthermore, by matching the components of the circuit (300) with the components of the circuit (100A), any variation, due for example, to temperature, process, manufacturing batch, etc., of the circuit (100A) is tracked by the circuit (300), so that a constant offset voltage across the capacitor C10, in spite of such variation can be maintained. Such matching of the components can therefore result in a first source follower circuit and a second source follower circuit which are effectively replica circuits of the source follower circuits of the circuit (100A) of FIG. 1A. More description of replica circuits and their benefits can be found, for example, in the above referenced cross references to the present application.

With further reference to the circuit (300) of FIG. 3, a person skilled in the art would know of many design techniques for implementing the difference circuit (310), such as, for example, a differential operational amplifier. Furthermore, as shown in FIG. 3, and offset voltage, Voffset, can be added to the voltage at the node V_N1 so to generate a biasing voltage Vctrl that provides a corresponding offset voltage across the capacitor C10 of the circuit (100A) of FIG. 1A in the absence of the RF1 and RF2 signals. A person skilled in the art would clearly know of many design technics for implementing such offset voltage, including, for example, via an offset voltage built into the difference circuit (310). Finally, and optionally, voltage stabilizing capacitors C31 and C32 may be coupled respectively between nodes V_N1 and V_P1 so to decouple any higher frequency components coupled to the circuit (300A), for example, from the RF1 and RF2 signals. It should be noted that the circuit (300A) may be permanently coupled to the circuit (100A) of FIG. 1A, or the circuit (200) of FIG. 2 for provision of the Vctrl biasing voltage.

As noted above, the circuits (100A) of FIG. 1A and (200) of FIG. 2 can measure a difference in amplitude and/or phase of two RF signals, RF1 and RF2. As can be taken from the above description, a principle of operation of such circuits is to charge and discharge a sampling capacitor (e.g., C10) asymmetrically, so that a charge time of the sampling capacitor within one cycle (e.g., half cycle) of the RF signals is substantially larger than a discharge time of the sampling capacitor within the one cycle (e.g., half cycle). As can also be taken from the above description, the charging of the sampling capacitor C10 can be based on a half cycle where a difference in peak voltages at the two nodes V_N1 and V_P1 is positive, and the discharging of the sampling capacitor can be based on a half cycle where the difference is negative.

Considering two RF signals RF1 and RF2 shown in the graph of FIG. 4A, where such two signals have a same phase and different amplitudes. As can be seen in the graph of FIG. 4A, during the positive cycle of the two RF signals, a peak voltage of the RF1 signal is larger than a peak voltage of the RF2 signal, with a positive difference in peak voltages represented in the figure by ΔPeak1. On the other hand, during a negative cycle of the two RF signals, a difference in peak voltages, ΔPeak2, is negative. Therefore, inputting such two RF signals to the circuit (100A) of FIG. 1A would clearly reproduce a differential voltage across the capacitor C10 that represents the value of ΔPeak1, and therefore a differential amplitude measurement of the RF1 and RF2 signals. Also, by using a complementary circuit (200) as described above in reference to FIG. 2, a differential voltage across a second capacitor C'10 representing the value −ΔPeak2 can be reproduced, and a sum of the two differences (ΔPeak1−ΔPeak2) be provided as a differential amplitude measurement of the two RF signals RF1 and RF2.

Figure 4B:
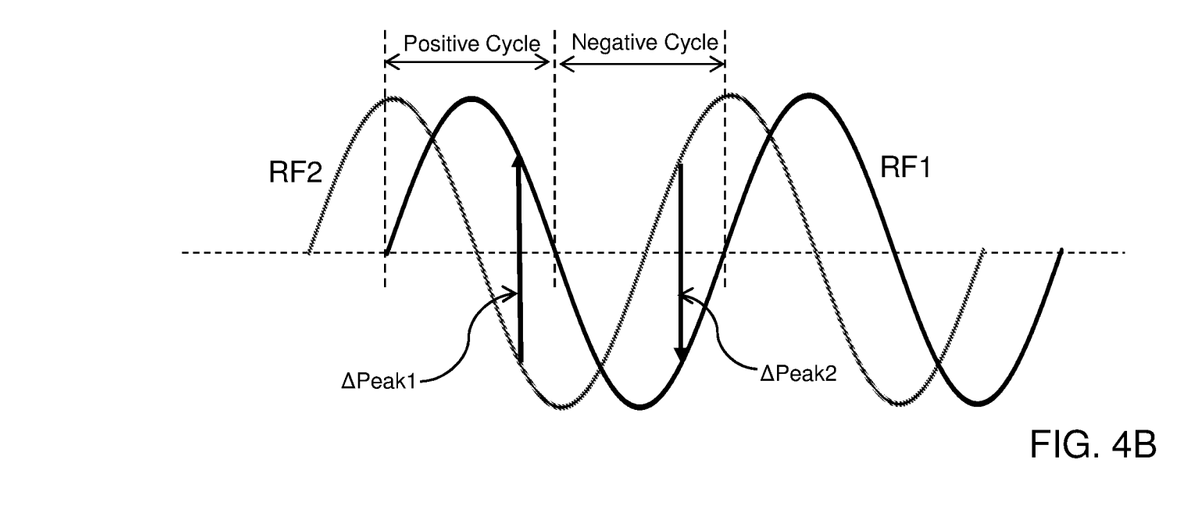

Considering two RF signals RF1 and RF2 shown in the graph of FIG. 4B, where such two signals have a same amplitude and different phases. As can be seen in the graph of FIG. 4B, during the positive cycle of the RF1 signal, there exists a peak in a positive voltage difference between the RF1 signal and the RF2 signal, represented in the figure by ΔPeak1. In other words, ΔPeak1 represents the largest positive voltage difference between the two RF signals. On the other hand, during a negative cycle of the RF1 signal, there exists a peak in a negative voltage difference between the RF1 and RF2 signals, represented in the figure by ΔPeak2. A person skilled in the art would understand that such peaks, ΔPeak1, ΔPeak2, may be of a same magnitude and proportional to a phase difference between the two signals RF1 and RF2, with the peak values being zero for in phase signals and maximum for one hundred and eighty degrees out of phase signals. Therefore, inputting such two RF signals to the circuit (100A) of FIG. 1A would clearly reproduce a differential voltage across the capacitor C10 that represents the value of ΔPeak1, and therefore a differential phase measurement of the RF1 and RF2 signals. Also, by using a complementary circuit (200) as described above in reference to FIG. 2, a differential voltage across a second capacitor C' 10 representing the value −ΔPeak2 can be reproduced, and a sum of the two differences (ΔPeak1−ΔPeak2) be provided as a differential phase measurement of the two RF signals RF1 and RF2.

With further reference to the differential phase and amplitude detector circuit according to the present teachings, it would be clear to a person skilled in the art that a differential voltage across the sampling capacitor C10 may represent a difference in phase and/or amplitude of the two signals RF1 and RF2. Based on the above description it would be also clear that such circuit can detect any instantaneous peak voltage difference between two signals that are not necessarily sinusoidal shape or have a same frequency. The circuit of block (210) in FIG. 2 may provide a low pass or integrating response to create an indication of an average of the difference in RF voltages (representing phase and/or amplitude difference). A time constant provided by the circuit block (210) may be set according to a desired response time and/or filtering effects.

The differential phase and amplitude detector circuit according to the present teachings can also be used to compare amplitude and/or phase of signals having triangle wave shape or square wave shape. Applications for the differential phase and amplitude detector circuit according to the present teachings can therefore include applications other than tuning of a main circuit via a replica circuit discussed above, such as, for example, phase lock loop and VCO applications where phase comparison of sinusoidal, triangle or square signals is performed. A person skilled in the art would clearly know of other applications where the simple, low power, small size, and fast differential amplitude and/or phase detection circuit according to the present teachings may be used.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A circuit arrangement comprising:
a first differential phase and amplitude detector, comprising:
an NMOS transistor;
a PMOS transistor;
a first input coupled to a gate node of the NMOS transistor, the first input configured for receiving a first radio frequency (RF) signal having a first voltage;
a second input coupled to a gate node of the PMOS transistor, the second input configured for receiving a second RF signal having a second voltage;
a differential output comprising a first node coupled to a source node of the NMOS transistor and a second node coupled to a source node of the PMOS transistor, and
a sampling capacitor coupled between the first node and the second node;
wherein:
when the first voltage and the second voltage are equal, a first DC biasing current flows through the NMOS transistor, a second DC biasing current flows through the PMOS transistor, and no current flows between the first node and the second node,
when the first voltage is larger than the second voltage, an excess current sourced by the NMOS transistor and sinked by the PMOS transistor flows from the first node to the second node to charge the sampling capacitor, the excess current having a magnitude that is substantially larger than the first DC biasing current, and
when the first voltage is smaller than the second voltage, no current flows between the NMOS transistor and the PMOS transistor, and the sampling capacitor is discharged by a portion of the first and the second DC biasing currents that flow from the second node to the first node.

2. The circuit arrangement according to claim 1, wherein:
the first RF signal and the second RF signal have a substantially same frequency, and
during a first half cycle of the frequency, the excess current charges the sampling capacitor by a charging voltage that represents a positive voltage difference between the first voltage and the second voltage.

3. The circuit arrangement according to claim 1, wherein:
during a second half cycle of the frequency, the portion of the first and the second DC biasing currents discharge the sampling capacitor by a discharging voltage that is substantially smaller than the charging voltage.

4. The circuit arrangement according to claim 3, wherein a ratio of the portion of the first and the second DC biasing currents to the excess current is about ⅕ or smaller.

5. The circuit arrangement according to claim 2, wherein:
during the first half cycle of the frequency, the excess current charges the sampling capacitor by a voltage that is equal to the positive voltage difference between the first voltage and the second voltage.

6. The circuit arrangement according to claim 2, wherein:
the positive voltage difference represents an amplitude difference between the first RF signal and the second RF signal.

7. The circuit arrangement according to claim 2, wherein:
the positive voltage difference represents a phase difference between the first RF signal and the second RF signal.

8. The circuit arrangement according to claim 2, wherein:
the NMOS transistor is configured as a first source follower circuit for controlling a voltage at the first node based on the first voltage, the first node coupled to a source node of the NMOS transistor and the first voltage provided to a gate of the NMOS transistor, and
the PMOS transistor is configured as a second source follower circuit for controlling a voltage at the second node based on the second voltage, the second node coupled to a source node of the PMOS transistor and the second voltage provided to a gate of the PMOS transistor.

9. The circuit arrangement according to claim 1, wherein the first differential phase and amplitude detector further comprises:
a first current source coupled between the first node and a reference ground, the first current source providing the first DC biasing current; and
a second current source coupled between a supply voltage and the second node, the second current source providing the second DC biasing current.

10. The circuit arrangement according to claim 1, wherein a ratio of the first DC biasing current to the second DC biasing current is based on a ratio of a size of the NMOS transistor to a size of the PMOS transistor.

11. The circuit arrangement according to claim 1, wherein the first differential phase and amplitude detector further comprises a biasing voltage control circuit configured to control a biasing voltage to the NMOS transistor to maintain a constant offset between voltages at the first and second nodes when the first voltage and the second voltage are zero.

12. The circuit arrangement according to claim 11, wherein the biasing voltage control circuit comprises:
   a second differential phase and amplitude detector that is a duplicate of the first differential phase and amplitude detector except configured to respectively receive a zero volts signal at the first input and the second input; and
   a voltage difference detector circuit coupled to the first and second nodes of the second differential phase and detector circuit, the voltage difference detector circuit configured to generate, at an output of the voltage difference detector circuit, a voltage that is proportional to a difference between voltages at the first and the second nodes,
   wherein the biasing voltage to the NMOS transistor of the first and the second differential phase and amplitude detector is based on the voltage at the output of the voltage difference detector circuit.

13. The circuit arrangement according to claim 1, further comprising:
   a second differential phase and amplitude detector that is a duplicate of the first differential phase and amplitude detector except configured to respectively receive the second radio frequency signal and the first radio frequency signal at the first input and the second input; and
   a differential combiner circuit coupled to respective differential outputs of the first and second differential phase and amplitude detectors and generate therefrom a combined differential voltage at a combined differential output.

14. The circuit arrangement according to claim 13, wherein the differential combiner circuit comprises:
   a first pair of series connected resistors coupled to one another via respective first terminals at a first common node, and coupled via respective second terminals to respective first nodes of the first and second differential phase and amplitude detectors;
   a second pair of series connected resistors coupled to one another via respective first terminals at a second common node, and coupled via respective second terminals to respective second nodes of the first and second differential phase and amplitude detectors; and
   an output capacitor coupled between the first and the second common nodes, a voltage across the output capacitor being the combined differential voltage.

15. The circuit arrangement according to claim 13, wherein the differential combiner circuit provides a low pass filtering function or an integrating function to generate an indication of an average of phase and/or amplitude difference between the first RF signal and the second RF signal.

16. A method for detecting a phase and amplitude difference between two RF signals, the method comprising:
   providing an NMOS transistor configured as a first source follower circuit for controlling a voltage at a first node based on a first voltage of a first input RF signal;
   providing a PMOS transistor configured as a second source follower circuit for controlling a voltage at a second node based on a second voltage of a second input RF signal;
   coupling a sampling capacitor between the first node and the second node;
   biasing the first and second source follower circuits, thereby maintaining a substantially fixed voltage across the sampling capacitor;
   inputting the first input RF signal to the first source follower circuit and inputting the second input RF signal to the second source follower circuit; and
   based on the inputting, charging the sampling capacitor when the first voltage is larger than the second voltage, and discharging the sampling capacitor when the first voltage is smaller than the second voltage,
   wherein the charging is at a rate that is substantially larger than a rate of the discharging.

17. The method according to claim 16, further comprising:
   based on the charging and the discharging, obtaining a voltage across the sampling capacitor that is proportional to a difference in phase and amplitude between the first RF signal and the second RF signal.

* * * * *